(12) United States Patent
Uchida et al.

(10) Patent No.: US 9,347,996 B2
(45) Date of Patent: May 24, 2016

(54) REMAINING LIFE DETERMINING SYSTEM FOR STATIONARY STORAGE BATTERY, AND METHOD OF DETERMINING REMAINING LIFE OF STATIONARY STORAGE BATTERY

(71) Applicants: Masatoshi Uchida, Toyota (JP);
Yasuhiro Takahashi, Miyoshi (JP);
Koichi Ichikawa, Kasugai (JP);
Masahiko Mitsui, Toyota (JP)

(72) Inventors: Masatoshi Uchida, Toyota (JP);
Yasuhiro Takahashi, Miyoshi (JP);
Koichi Ichikawa, Kasugai (JP);
Masahiko Mitsui, Toyota (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 504 days.

(21) Appl. No.: 13/936,642

(22) Filed: Jul. 8, 2013

(65) Prior Publication Data

US 2014/0015532 A1 Jan. 16, 2014

(30) Foreign Application Priority Data

Jul. 12, 2012 (JP) ................................. 2012-156808

(51) Int. Cl.
*G01N 27/416* (2006.01)
*G01R 31/36* (2006.01)

(52) U.S. Cl.
CPC ........ *G01R 31/3606* (2013.01); *G01R 31/3679* (2013.01); *G01R 31/3648* (2013.01)

(58) Field of Classification Search
CPC .................................................... G01R 31/3606
USPC .................................................. 324/426, 434
See application file for complete search history.

(56) References Cited

U.S. PATENT DOCUMENTS

| 2011/0082621 A1* | 4/2011 | Berkobin | ............ | B60L 11/1824 |
| | | | | 701/31.4 |
| 2013/0015702 A1 | 1/2013 | Ito | | |
| 2013/0033102 A1* | 2/2013 | Goff | ...................... | H02J 7/0014 |
| | | | | 307/10.6 |

FOREIGN PATENT DOCUMENTS

| CN | 1913217 A | 2/2007 |
| JP | 2001015180 A | 1/2001 |
| JP | 2011-064571 A | 3/2011 |
| WO | 2011121755 A1 | 10/2011 |

* cited by examiner

*Primary Examiner* — Richard V Muralidar
(74) *Attorney, Agent, or Firm* — Sughrue Mion, PLLC

(57) ABSTRACT

A remaining life determining system for a stationary storage battery has a detecting unit configured to detect an evaluation value indicative of a deterioration level of the stationary storage battery, a first storage unit configured to store a usage history of the stationary storage battery, a second storage unit configured to store remaining life information associated with usage information of the stationary storage battery, a third storage unit configured to store remaining life basic information of the stationary storage battery, and a controller configured to estimate the remaining life of the stationary storage battery, from the usage history, the evaluation value, and the remaining life information.

7 Claims, 7 Drawing Sheets

REMAINING LIFE DETERMINING SYSTEM FOR STATIONARY STORAGE BATTERY, AND METHOD OF DETERMINING REMAINING LIFE OF STATIONARY STORAGE BATTERY

INCORPORATION BY REFERENCE

The disclosure of Japanese Patent Application No. 2012-156808 filed on Jul. 12, 2012 including the specification, drawings and abstract is incorporated herein by reference in its entirety.

BACKGROUND OF THE INVENTION

1. Field of the Invention

The invention relates to a remaining life determining system for estimating the remaining life of a stationary storage battery obtained by recycling a battery used in a vehicle, or the like, and a method of determining the remaining life of the stationary storage battery.

2. Description of Related Art

A power storage device that supplies electric power to a motor for running a vehicle is installed on an electric vehicle, or a hybrid vehicle. The power storage device deteriorates due to repeated charge and discharge. A method of assessing the remaining life of the power storage device is disclosed in, for example, Japanese Patent Application Publication No. 2011-64571 (JP 2011-64571 A). According to the method, the usage state of a dead battery as a battery that has reached the end of its life, and dead-battery charging characteristics as charging characteristics of the dead battery when it is charged according to a predetermined charging sequence, are associated with each other and stored into information storage means for storing information, and the usage state of a battery to be assessed (which will be called "test battery"), and test charging characteristics as charging characteristics of the test battery when it is charged according to the predetermined charging sequence, are obtained. Then, the remaining life of the test battery is assessed or determined from the relationship between the obtained test charging characteristics, and corresponding dead-battery charging characteristics as the dead-battery charging characteristics associated with the usage state of the dead battery corresponding to the obtained usage state of the test battery, as a part of the information stored in the information storage means.

FIG. 6 schematically illustrates the database structure of estimated information obtained by estimating chronological changes of a vehicle battery. In a hybrid vehicle, for example, the current value of the vehicle battery changes from moment to moment, due to changes in running conditions, etc., resulting in a large number of charge/discharge patterns. Therefore, a large number of remaining life maps used for determining the remaining life of the vehicle battery need be prepared in accordance with the number of the charge/discharge patterns.

SUMMARY OF THE INVENTION

As shown in FIG. 7, charge/discharge patterns of a stationary storage battery are not so complicated as those of the vehicle battery. Namely, the stationary storage battery is charged and discharged with a constant current, and thus requires a smaller number of remaining life maps than the vehicle battery. Therefore, when the remaining life of the stationary storage battery is determined, the same determining method as that in the case of the vehicle battery need not be used. If the same determining method is used, the determining process becomes complicated and time-consuming.

Thus, the invention provides a remaining life determining system that estimates the remaining life of the stationary storage battery by a simple method.

A remaining life determining system for a stationary storage battery according to a first aspect of the invention includes a detecting unit configured to detect an evaluation value indicative of a deterioration level of the stationary storage battery, a first storage unit configured to store a usage history of the stationary storage battery, a second storage unit configured to store remaining life information associated with usage information of the stationary storage battery, a third storage unit configured to store remaining life basic information of the stationary storage battery in advance, and a controller configured to estimate a remaining life of the stationary storage battery, from the usage history stored in the first storage unit, the evaluation value, and the remaining life information, when the remaining life information corresponding to the usage history is stored in the second storage unit. The controller is also configured to estimate the remaining life of the stationary storage battery, from the usage history stored in the first storage unit, the evaluation value, and the remaining life basic information stored in the third storage unit, when the remaining life information corresponding to the usage history is not stored in the second storage unit.

In the remaining life determining system as described above, the stationary storage battery may supply electric power to a household appliance.

The remaining life determining system as described above may further include a display unit, and the controller may display information useful for rebuilding the stationary storage battery, on the display unit, when the remaining life is estimated. With this arrangement, the information useful for rebuilding the stationary storage battery is displayed along with the estimated remaining life, thus eliminating the need to determine at another time whether the stationary storage battery is to be rebuilt.

In the system as described above, the stationary storage battery may be obtained by recycling a vehicle battery that supplies electric power to a motor for running the vehicle, and the controller may obtain the usage history of the stationary storage battery from the vehicle via communications. With this arrangement, the usage history can be obtained from the vehicle; therefore, the state of the battery need not be checked after the stationary storage battery is removed from the vehicle, and the remaining life can be determined in a short time.

In the system as described above, the evaluation value may be at least one of an actual discharge capacity and an internal resistance of the stationary storage battery.

In the system as described above, the remaining life basic information may be remaining life information concerning the stationary storage battery that has not been used.

A method of determining a remaining life of a stationary storage battery according to a second aspect of the invention includes: detecting an evaluation value indicative of a deterioration level of the stationary storage battery; storing a usage history of the stationary storage battery in a first storage unit; storing remaining life information associated with usage information of the stationary storage battery in a second storage unit; reading remaining life basic information of the stationary storage battery stored in a third storage unit; estimating the remaining life of the stationary storage battery, from the usage history, the evaluation value and the remaining life information, when the remaining life information corresponding to the usage history is stored; and estimating the remaining life of the stationary storage battery, from the usage history, the evaluation value and the remaining life basic information, when the remaining life information corresponding to the usage history is not stored.

According to the present invention, the remaining life determining system and remaining life determining method are provided for estimating the remaining life of the stationary storage battery by a simple method.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
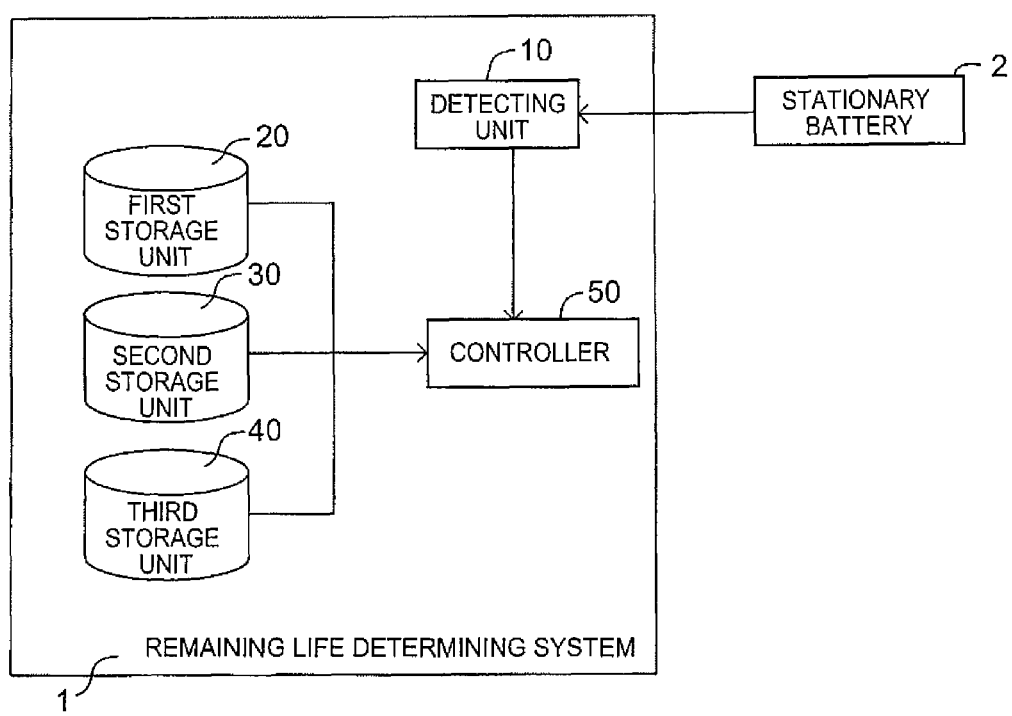
FIG. 1 is a functional block diagram of a remaining life determining system.

One embodiment of the invention will be described with reference to the drawings. FIG. 1 is a functional block diagram of a remaining life determining system. The remaining life determining system 1 has a detecting unit 10, a first storage unit 20, a second storage unit 30, a third storage unit 40, and a controller 50.

The detecting unit 10 obtains an evaluation value indicative of a deterioration level (or a degree of deterioration) of a stationary storage battery 2. Here, the evaluation value may be the actual discharge capacity, or the internal resistance. The actual discharge capacity can be calculated from the integrated amount of current when the stationary storage battery 2 is discharged from a voltage value corresponding to the fully charged state (SOC=100%) to a discharge cutoff voltage value. The internal resistance can be calculated from a current value and a voltage value obtained when the stationary storage battery 2 is discharged. Here, the internal resistance of the stationary storage battery 2 varies according to the SOC and the temperature. Therefore, the internal resistance calculated from the voltage value and the current value may be corrected, according to the current SOC and temperature of the stationary storage battery 2.

The detecting unit 10 includes a current sensor, a voltage sensor, and a temperature sensor or sensors. The current sensor detects the current of the stationary storage battery 2. The voltage sensor detects the total voltage of the stationary storage battery 2. The voltage sensor may detect the voltage of each of blocks into which the stationary storage battery 2 is divided. In this case, the sum of the respective block voltages is detected as the total voltage of the stationary storage battery 2. One temperature sensor, or two or more temperature sensors, may be provided for the stationary storage battery 2. A thermistor may be used as the temperature sensor. The detecting unit 10 also functions as a calculating unit that calculates the evaluation value (the actual discharge capacity, the internal resistance) as will be described later, from the obtained current value and voltage value.

The stationary storage battery 2 supplies electric power to a household appliance or appliances (such as an air conditioner and a rice cooker). A used battery for a vehicle is used as the stationary storage battery 2. In this connection, the vehicle battery stores electric power to be supplied to a motor for running the vehicle, and is installed on the vehicle. The vehicle battery has a plurality of battery modules. Conventionally, if at least one of the battery modules becomes unable to be used due to its deterioration, for example, the whole vehicle battery has to be replaced by a new one. Furthermore, the replaced vehicle battery is discarded even if one or more operative or usable battery modules remain in the battery. According to this embodiment, the vehicle battery that has been conventionally discarded can be reused as the stationary storage battery.

Figure 2A:
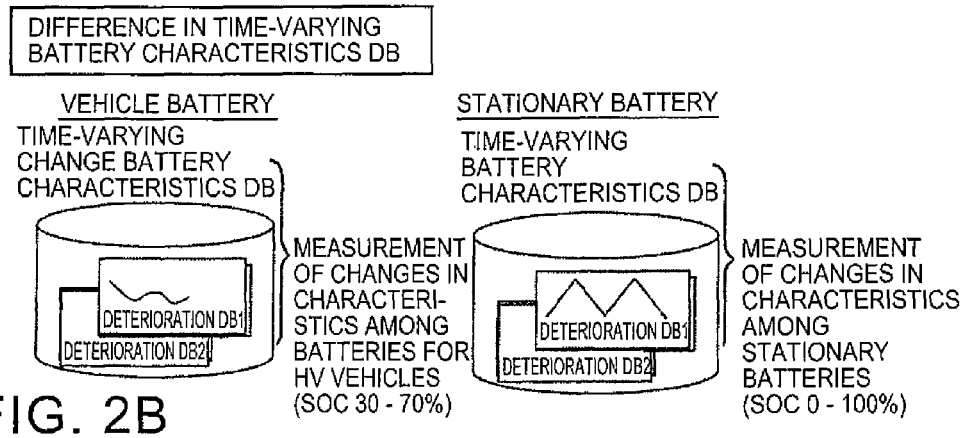
FIG. 2A, FIG. 2B and FIG. 2C are characteristics views showing differences between a vehicle battery installed on a hybrid vehicle, and a stationary storage battery used as a household power supply.
Figure 2B:
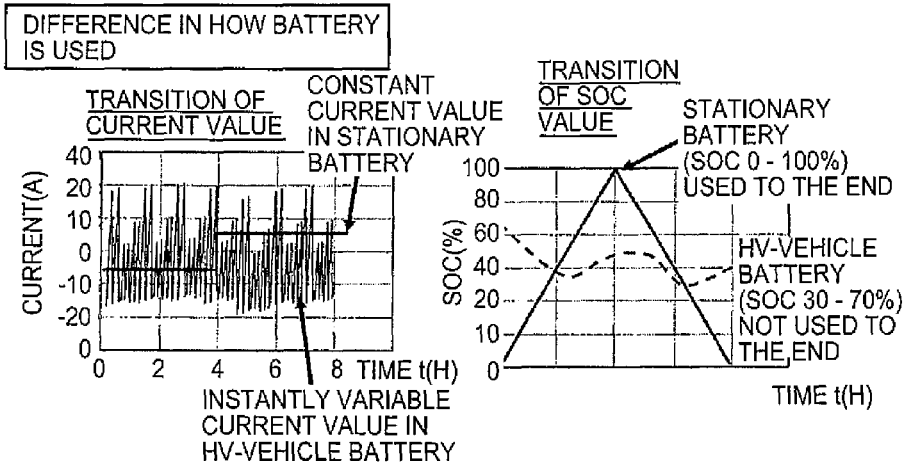
Figure 2C:
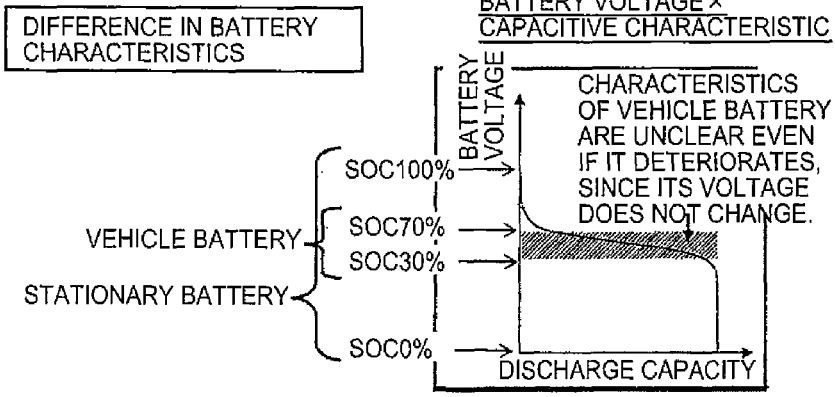

The characteristics views of FIG. 2A, FIG. 2B and FIG. 2C show differences between a vehicle battery installed on a hybrid vehicle, and the stationary storage battery 2 used as a household power supply. The hybrid vehicle is one type of vehicle that uses the vehicle battery and an internal combustion engine as power sources. The vehicle battery is used while the SOC is within the range of 30-70%, for example. On the other hand, the stationary storage battery 2 is normally used while the SOC is within the range of 0-100%. The current value of the vehicle battery changes from moment to moment during charge and discharge, and the fluctuation range of the current value is considerably large. On the other hand, the stationary storage battery 2 is subjected to constant current charge/discharge, namely, is charged or discharged with a constant current, and therefore, the fluctuation range of the current value is smaller than that of the vehicle battery. Here, the "constant current charge/discharge" means that the value of current discharged to the same load is constant within a certain period, and includes the case where the current value fluctuates due to current ripple, for example. Also, since the vehicle battery is used while the SOC is within the range of 30-70%, the voltage fluctuation range is relatively small, and battery characteristics cannot be easily grasped even if the battery deteriorates. On the other hand, the stationary storage battery 2 is used while the SOC is within the range of 0-100%; therefore, the voltage fluctuation range is relatively large, and battery characteristics can be easily grasped when the battery deteriorates.

Referring again to FIG. 1, the first storage unit 20 stores the usage history of the stationary storage battery 2. Here, the usage history includes information for specifying a remaining life map (remaining life information), and information needed to be used when the remaining life is estimated from the specified remaining life map. The information for specifying the remaining life map includes "usage environment (temperature, installation location)". The information needed to be used when the remaining life is estimated from the remaining life map will be described later.

The second storage unit 30 stores remaining life maps associated with the usage information of the stationary storage battery 2. The usage information of the stationary storage battery 2 corresponds to the usage history stored in the first storage unit 20. Namely, in the second storage unit 30, a plurality of remaining life maps associated with the usage environment of the stationary storage battery 2 are stored. The deterioration level of the stationary storage battery 2 depends on the temperature and the installation location as the usage environment. Therefore, the remaining life map is provided for each temperature and each installation location. Here, the remaining life map may be provided for each of the temperatures having an interval of 1° C., or for each specified temperature range. The installation location means the location of installation, such as outdoor or indoor installation, of the stationary storage battery 2, and the remaining life map is provided for each installation location. The remaining life maps may be obtained in advance by experiment or through simulation, and may be updated as needed, through measurements of the current, voltage, temperature, etc. during use of the stationary storage battery 2. The stationary storage battery 2 is different from the vehicle battery in that the battery 2 is subjected to constant current charge/discharge; therefore, the remaining life of the stationary storage battery 2 can be estimated with high accuracy, even in the absence of an enormous number of remaining life maps that would be needed for the vehicle battery.

Figure 3:
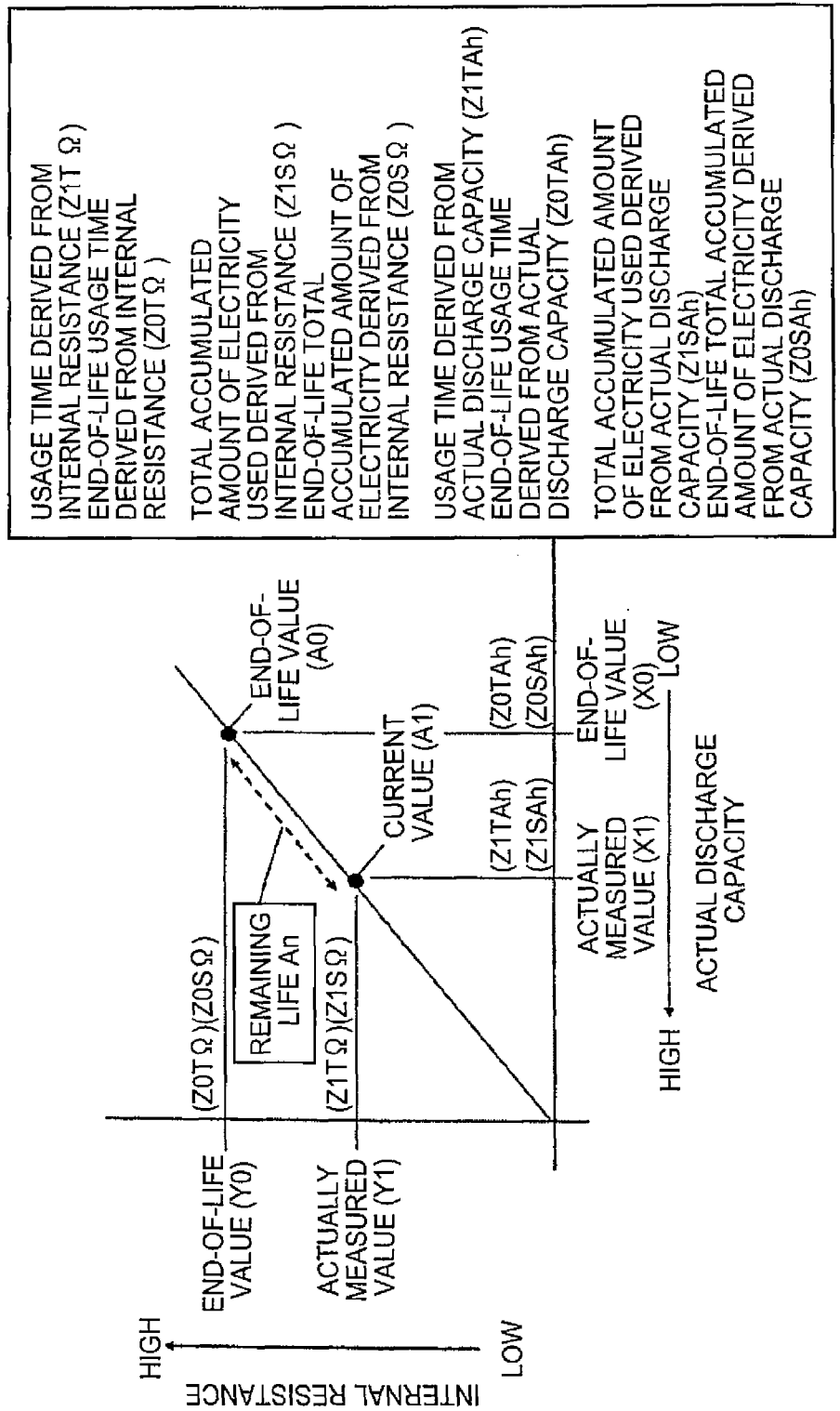
FIG. 3 is a view illustrating one example of remaining life map.

FIG. 3 is a schematic view of a remaining life map, in which the horizontal axis indicates the actual discharge capacity, and the vertical axis indicates the internal resistance. In FIG. 3, the actual discharge capacity increases toward the origin, while the internal resistance decreases toward the origin. The remaining life of the stationary storage battery 2 can be estimated from the remaining life time T, or the total accumulated amount Q of electricity that can be used. The remaining life time T can be obtained from the actual discharge capacity, or the internal resistance. When the actual discharge capacity is used, the remaining life time T can be calculated according to the following equation (1).

$$T=Z0TAh(=Z1TAh \times X0/X1)-Z1TAh \qquad (1)$$

In the above equation (1), "Z1TAh" represents the usage time, or the length of time for which the stationary storage battery 2 has been used, which is stored in the first storage unit 20. The "Z1TAh" corresponds to "the information needed to be used when the remaining life is estimated from the remaining life map" as described above. "X0" represents the actual discharge capacity when the stationary storage battery 2 reaches the end of its life. "X1" represents the actual discharge capacity of the stationary storage battery 2 detected by the detecting unit 10.

When the internal resistance is used, the remaining life time T can be calculated according to the following equation (2).

$$T=Z0T\Omega(=Z1T\Omega \times Y0/Y1)-Z1T\Omega \qquad (2)$$

In the above equation (2), "Z1TΩ" represents the usage time, or the length of time for which the stationary storage battery 2 has been used, which is stored in the first storage unit 20. The "Z1TΩ" corresponds to "the information needed to be used when the remaining life is estimated from the remaining life map" as described above. "Y0" represents the internal resistance detected when the stationary storage battery 2 reaches the end of its life. "Y1" represents the internal resistance of the stationary storage battery 2 detected by the detecting unit 10.

The total accumulated amount Q of electricity that can be used can be obtained from the actual discharge capacity, or the internal resistance. When the actual discharge capacity is used, the total accumulated amount Q of electricity that can be used can be calculated according to the following equation (3).

$$Q=Z0SAh(=Z1SAh \times X0/X1)-Z1SAh \qquad (3)$$

In the above equation (3), "Z1SAh" represents the total accumulated amount of electricity stored in the first storage unit 20. The "Z1SAh" corresponds to "the information needed to be used when the remaining life is estimated from the remaining life map" as described above. "X0" and "X1", which have been explained above, will not be explained again.

When the internal resistance is used, the total accumulated amount of electricity that can be used can be calculated according to the following equation (4).

$$Q=Z0S\Omega(=Z1S\Omega \times Y0/Y1)-Z1S\Omega \qquad (4)$$

In the above equation (4), "Z1SΩ" represents the total accumulated amount of electricity stored in the first storage unit 20. The "Z1SΩ" corresponds to "the information needed to be used when the remaining life is estimated from the remaining life map" as described above. "Y0" and "Y1", which have been explained above, will not be explained again.

The controller 50 can define one of the solutions of the above equations (1)-(4), which provides the shortest life, as the remaining life. The controller 50 may also define at least one of the solutions of the above equations (1)-(4), as the remaining life. For example, the controller 50 can define one of the solutions of the above equations (2) and (4), which provides the shorter life, as the remaining life of the stationary storage battery 2, based on the internal resistance. In this case, the evaluation value obtained by the detecting unit 10 may consist solely of the internal resistance. The controller 50 can define one of the solutions of the above equations (1) and (3), which provides the shorter life, as the remaining life of the stationary storage battery 2, based on the actual discharge capacity. In this case, the evaluation value obtained by the detecting unit 10 may consist solely of the actual discharge capacity.

The controller 50 can define one of the solutions of the above equations (1) and (2) representing the remaining life time T, which provides the shorter life, as the remaining life of the stationary storage battery 2. In this case, the total accumulated amount of electricity may be omitted from the usage history stored in the first storage unit 20. The controller 50 can define one of the solutions of the above equations (3) and (4) representing the total accumulated amount of electricity Q, which provides the shorter life, as the remaining life of the stationary storage battery 2. In this case, the usage time up to the present time may be omitted from the usage history stored in the first storage unit 20. Thus, the "usage history" stored in the first storage unit 20 can be changed according to the method of calculating the remaining life. The controller 50 may include CPU, MPU, or an ASIC circuit that executes at least a part of processing performed by the CPU, or the like.

The third storage unit 40 stores a remaining life basic map of the stationary storage battery 2. The remaining life basic map may be a remaining life map in the initial state of the stationary storage battery 2. The initial state of the stationary storage battery 2 means a state immediately after the stationary storage battery 2 is produced, namely, before the battery 2 is installed on the vehicle. The remaining life basic map is defined as design information. In a different point of view, the remaining life basic map may also be obtained from test result data.

The first storage unit 20, second storage unit 30 and the third storage unit 40 may be realized by a single storage device, or may be realized by two or more storage devices that work together. Namely, the storage device may have any hardware configuration provided that necessary information can be read when the remaining life is determined.

Figure 4:
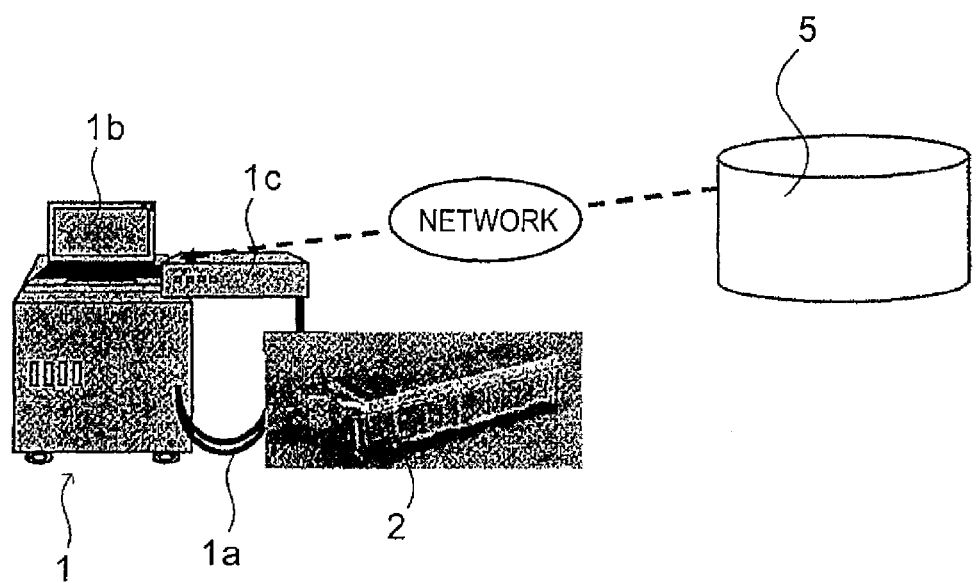
FIG. 4 is a schematic view showing the construction of the remaining life determining system.

FIG. 4 is a schematic view showing the hardware configuration of the remaining life determining system 1. The remaining life determining system 1 is connected to the stationary storage battery 2 via a cable 1a, and obtains various kinds of information for determining the remaining life of the stationary storage battery 2, via the cable 1a. The remaining life determining system 1 has a display unit 1b. On the display unit 1b, the calculated remaining life of the stationary storage battery 2, and selection information that permits the user to select a method (rebuilding method) for improving the life of the deteriorated stationary storage battery 2, are displayed.

The remaining life determining system 1 has a charging/discharging device 1c. The charging/discharging device 1c performs an operation to charge the stationary storage battery 2 to bring it into a fully charged state, and performs an operation to discharge the fully charged stationary storage battery 2 until its voltage becomes equal to the discharge cutoff voltage. Through these operations, the current actual discharge capacity and internal resistance of the stationary storage battery 2 as described above are calculated. The remaining life determining system 1 obtains various kinds of information, via a network, from a battery manufacturer database 5.

Figure 5:
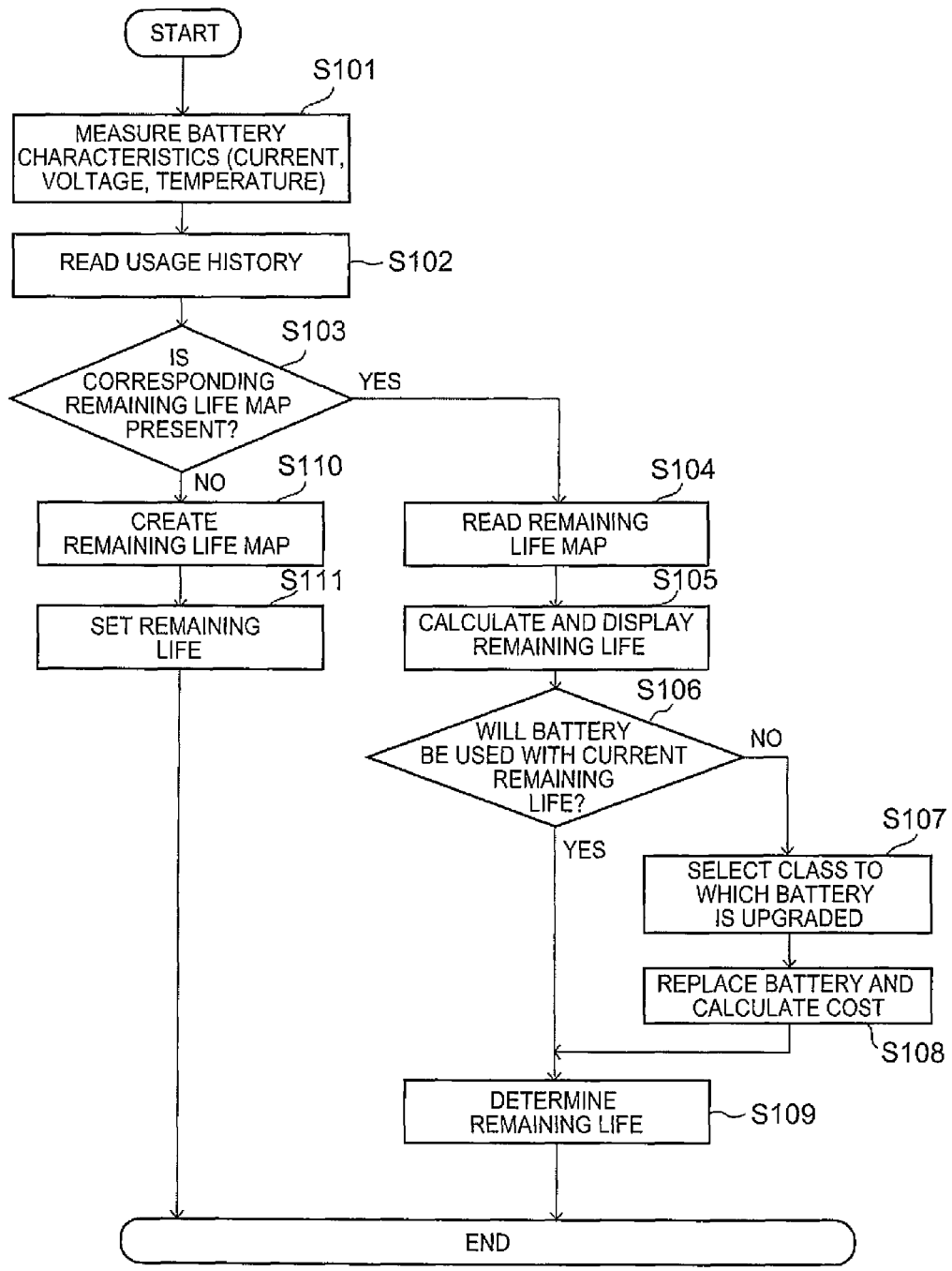
FIG. 5 is a flowchart illustrating a method of determining the remaining life of the stationary storage battery.
Figure 6:
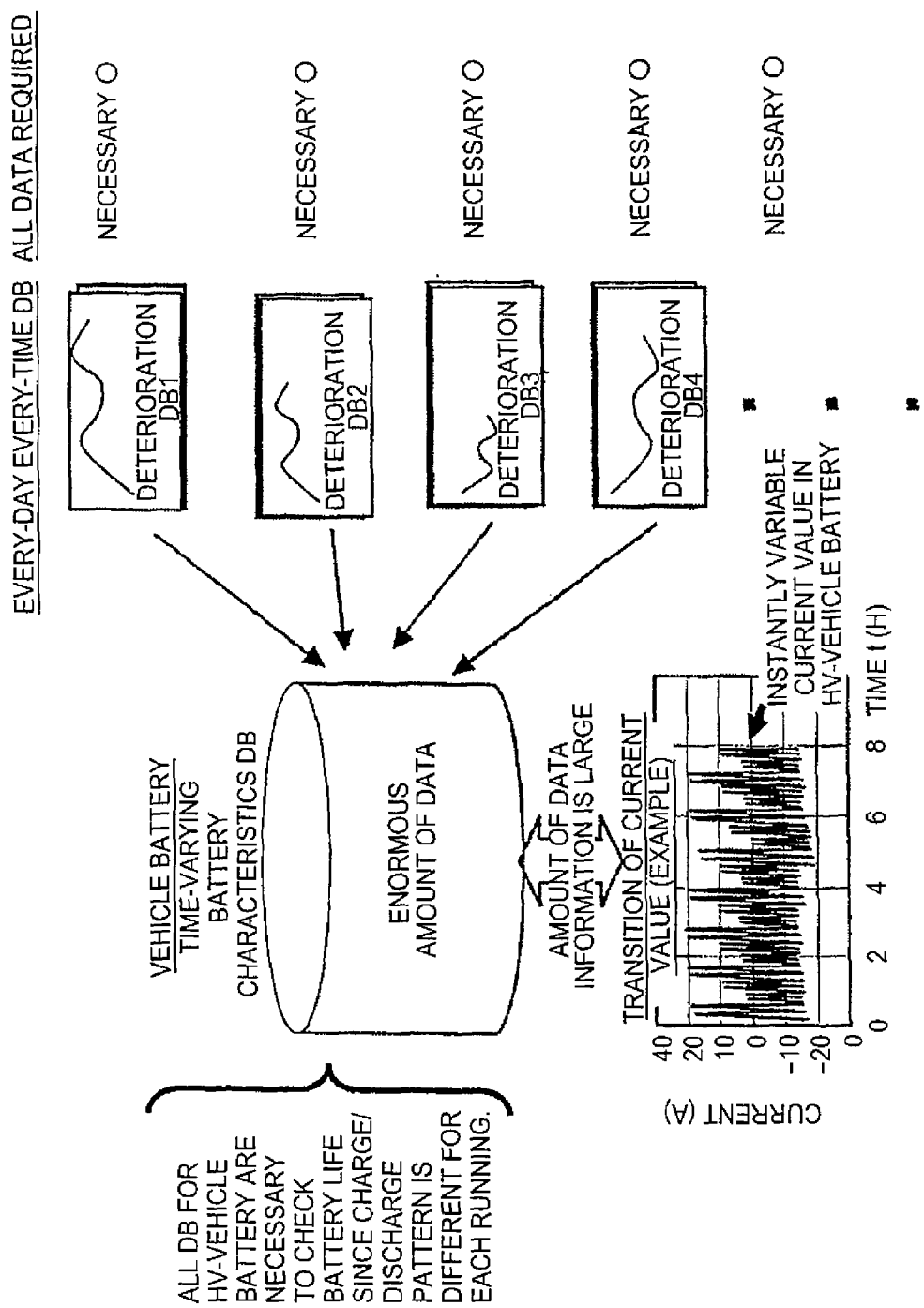
FIG. 6 shows the database structure indicating the number of remaining life maps for a vehicle battery, etc.
Figure 7:
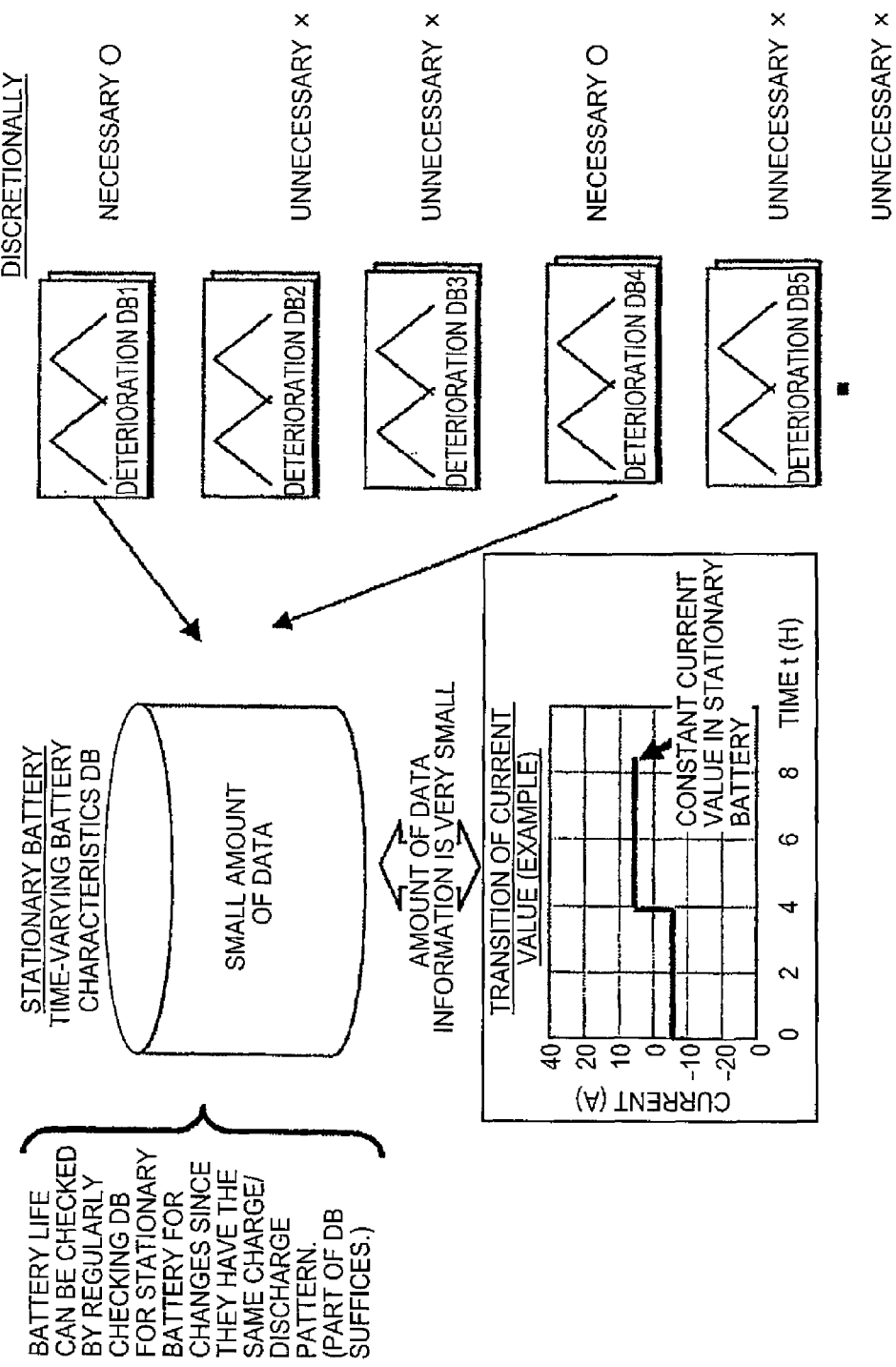
FIG. 7 shows the database structure indicating the number of remaining life maps for a stationary storage battery.

Next, the processing performed by the controller 50 will be described with reference to the flowchart of FIG. 5. In step S101, the controller 50 obtains battery characteristics (current, voltage, temperature) of the stationary storage battery 2 detected by the detecting unit 10. In step S102, the controller 50 reads the usage history from the first storage unit 20. In step S103, the controller 50 determines whether a remaining life map corresponding to the usage history read in step S102 is stored in the second storage unit 30.

If the remaining life map corresponding to the usage history is stored in the second storage unit 30 (YES in step S103), the control proceeds to step S104. If no remaining life map corresponding to the usage history is stored in the second storage unit 30 (NO in step S103), the control proceeds to step S110.

In step S104, the controller 50 reads the remaining life map corresponding to the usage history, from the second storage unit 30. In step S105, the controller 50 calculates the remaining life, based on the usage time (the length of time for which the battery 2 has been used) stored in the first storage unit 20, and the actual discharge capacity and internal resistance obtained from the battery characteristics, and displays the calculated remaining life on the display unit 1b.

After the remaining life is calculated, the controller 50 may execute steps S106-S109, so as to perform a rebuilding operation to recover the remaining life of the stationary storage battery 2. In step S106, the controller 50 displays, on the display unit 1b, a selection screen that permits the user to select whether the stationary storage battery 2 continues to be used. If the stationary storage battery 2 continues to be used with the current remaining life (YES in step S106), the control proceeds to step S109. If the stationary storage battery 2 does not continue to be used with the current remaining life (NO in step S106), namely, the user wishes to improve the remaining life, the control proceeds to step S107.

In step S107, the controller 50 displays two or more plans (corresponding to rebuilding information) for improving the remaining life, on the display unit 1b. The two or more plans may include an A plan for prolonging the life to be 80% or more of that of a new product, and a B plan for prolonging the life to be 50-80% of that of the new product. In step S108, an operator replaces a module(s) of a part of the stationary storage battery 2 with a new one(s) according to the selected plan, and calculates the cost for replacement. Thus, since it is determined whether the battery needs to be rebuilt, following the step of estimating the remaining life, there is no need to determine at another time whether the battery needs to be rebuilt. In step S109, the controller 50 determines the remaining life of the new stationary storage battery 2.

In step S110, the controller 50 calculates the remaining life from the remaining life map at the time when the battery 2 is produced, which map is stored in the third storage unit 40, based on the usage time (the length of time for which the battery 2 has been used) stored in the first storage unit 20, and the actual discharge capacity and internal resistance obtained from the battery characteristics. In step S111, the controller 50 recognizes the calculated remaining life as the actual remaining life.

According to the method of calculating the remaining life in this embodiment, the amount of data information of remaining life maps may be small. Therefore, the remaining life can be calculated by a simple method, in a short time, as compared with the case where the remaining life of the battery installed on a vehicle is estimated.

Modified Embodiment

While the method of determining the remaining life after the use of the stationary storage battery 2 has been described in the illustrated embodiment, the invention is not limited to this method, but may be applied to another method. For example, the remaining life of the stationary storage battery 2 may be determined, immediately after a battery installed on a vehicle is removed from the vehicle (namely, before the battery is used as the stationary storage battery 2). In this case, the usage history of the stationary storage battery 2 may be obtained from the vehicle. Namely, characteristics of the stationary storage battery 2 installed on the vehicle are measured, and the measured characteristics are accumulated as the usage history in a database of the vehicle. When the battery life is to be determined, the accumulated usage history may be stored into the first storage unit 20. Also, the usage history stored in the first storage unit 20 may include "purpose of use". The purpose of use is a purpose for which the vehicle is used. For example, there is a difference in the deterioration level of the battery, between a vehicle that frequently runs at high speed, and a vehicle that frequently runs at low speed; therefore, the purpose of use and the remaining life maps may be associated with each other and stored in the second storage unit 30.

According to the modified embodiment, the usage history of the battery can be obtained from the vehicle; therefore, the state of the battery need not be checked when the battery is removed from the vehicle. As a result, the processing time required to determine the remaining life of the stationary storage battery 2 is shortened.

What is claimed is:

1. A remaining life determining system for a stationary storage battery, comprising:
   a detecting unit configured to detect an evaluation value indicative of a deterioration level of the stationary storage battery;
   a first storage unit configured to store a usage history of the stationary storage battery;
   a second storage unit configured to store remaining life information associated with usage information of the stationary storage battery;
   a third storage unit configured to store remaining life basic information of the stationary storage battery in advance; and
   a controller configured to estimate a remaining life of the stationary storage battery, from the usage history stored in the first storage unit, the evaluation value, and the remaining life information, when the remaining life information corresponding to the usage history is stored in the second storage unit, the controller being configured to estimate the remaining life of the stationary storage battery, from the usage history stored in the first storage unit, the evaluation value, and the remaining life basic information stored in the third storage unit, when the remaining life information corresponding to the usage history is not stored in the second storage unit.

2. The remaining life determining system according to claim 1, wherein the stationary storage battery supplies electric power to a household appliance.

3. The remaining life determining system according to claim 1 further comprising:
a display unit, wherein
the controller displays information useful for rebuilding the stationary storage battery, on the display unit, when the remaining life is estimated.

4. The remaining life determining system according to claim 1, wherein the stationary storage battery is obtained by recycling a vehicle battery that supplies electric power to a motor for running the vehicle, and the controller obtains the usage history of the stationary storage battery from the vehicle via communications.

5. The remaining life determining system according to claim 1, wherein the evaluation value comprises at least one of an actual discharge capacity and an internal resistance of the stationary storage battery.

6. The remaining life determining system according to claim 1, wherein the remaining life basic information comprises remaining life information concerning the stationary storage battery that has not been used.

7. A method of determining a remaining life of a stationary storage battery, comprising:
detecting an evaluation value indicative of a deterioration level of the stationary storage battery;
storing a usage history of the stationary storage battery in a first storage unit;
storing remaining life information associated with usage information of the stationary storage battery in a second storage unit;
reading remaining life basic information of the stationary storage battery stored in a third storage unit;
estimating the remaining life of the stationary storage battery, from the usage history, the evaluation value and the remaining life information, when the remaining life information corresponding to the usage history is stored; and
estimating the remaining life of the stationary storage battery, from the usage history, the evaluation value and the remaining life basic information, when the remaining life information corresponding to the usage history is not stored.

* * * * *